(12) United States Patent
Khenkin et al.

(10) Patent No.: US 9,736,594 B2
(45) Date of Patent: Aug. 15, 2017

(54) MICROELECTROMECHANICAL SYSTEMS ELECTRET MICROPHONE

(71) Applicant: INVENSENSE, INC., San Jose, CA (US)

(72) Inventors: Aleksey S. Khenkin, Nashua, NH (US); Mike Daneman, Campbell, CA (US)

(73) Assignee: INVENSENSE, INC., San Jose, CA (US)

( * ) Notice: Subject to any disclaimer, the term of this patent is extended or adjusted under 35 U.S.C. 154(b) by 313 days.

(21) Appl. No.: 14/561,843

(22) Filed: Dec. 5, 2014

(65) Prior Publication Data

US 2016/0165355 A1 Jun. 9, 2016

(51) Int. Cl.
*H04R 19/01* (2006.01)
*H04R 31/00* (2006.01)
*B81B 3/00* (2006.01)

(52) U.S. Cl.
CPC ............ *H04R 19/016* (2013.01); *B81B 3/00* (2013.01); *H04R 31/003* (2013.01); *H04R 2201/003* (2013.01)

(58) Field of Classification Search
CPC ............................ H04R 19/016; H04R 31/003
USPC .......................................................... 307/151
See application file for complete search history.

(56) References Cited

U.S. PATENT DOCUMENTS 8,258,591 B2 * 9/2012 Lee ..................... B81C 1/00246
257/416

* cited by examiner

*Primary Examiner* — Robert Deberadinis
(74) *Attorney, Agent, or Firm* — Amin, Turocy & Watson, LLP

(57) ABSTRACT

Microelectromechanical systems (MEMS) electret acoustic sensors or microphones, devices, systems, and methods are described. Exemplary embodiments employ electret comprising an inorganic dielectric material such as silicon nitride in MEMS electret acoustic sensors or microphones. Provided implementations include variations in electret acoustic sensor or microphone configuration and recharging of the electret.

20 Claims, 8 Drawing Sheets

MICROELECTROMECHANICAL SYSTEMS ELECTRET MICROPHONE

TECHNICAL FIELD

The subject disclosure relates to microelectromechanical systems (MEMS) sensors and more particularly to MEMS electret acoustic sensors or microphones, devices, systems, and methods therefor.

BACKGROUND

Markets for highly integrated and low power devices require compact and low-power component designs. However, conventional microelectromechanical systems MEMS microphones, like traditional condenser microphones, typically employ bias voltages (e.g., via charge pumps, etc.) to create and maintain the voltage difference between a movable membrane and a stationary electrode. Conventional MEMS microphones do not use electret designs, in part, because suitable dielectric material (e.g., polytetrafluoroethylene (PTFE) or another of a number of plastics or polymers) cannot survive high temperatures encountered in MEMS processes typical of semiconductor fabrication processes.

While some semiconductor electret capacitor designs for microphones have been proposed, such designs have met with limited commercial success, in part because of their retention of PTFE or other plastics or polymers, which limits the availability of semiconductor processes available, which, in turn, can limit the ability of such designs to scale down in size. Another reason for the long felt need for such compact and low-power component designs provided by a MEMS electret microphone is that, because charge pumps can be employed in MEMS devices for a variety of complementary purposes, it is straightforward to use them in conjunction with conventional MEMS condenser microphones.

It is thus desired to provide sensor devices and/or techniques that improve upon these and other deficiencies. The above-described deficiencies are merely intended to provide an overview of some of the problems of conventional implementations, and are not intended to be exhaustive. Other problems with conventional implementations and techniques and corresponding benefits of the various aspects described herein may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

Various embodiments of the subject disclosure provide MEMS electret acoustic sensors or microphones, devices, systems, and methods. For instance, exemplary embodiments can employ electrets comprising an inorganic dielectric material such as, e.g., silicon nitride, in MEMS electret acoustic sensors or microphones. Provided implementations include variations in electret acoustic sensor or microphone configuration and recharging of the electret.

In a non-limiting example, exemplary devices can comprise a first electrode and a second electrode associated with a MEMS electret acoustic sensor or microphone. In non-limiting aspects, exemplary device can further comprise an electret comprising an inorganic dielectric material such as, e.g., silicon nitride, disposed on or associated with the first electrode or the second electrode. In further non-limiting aspects, an exemplary electret can store a charge to facilitate providing a potential difference between the first electrode and the second electrode associated with the MEMS electret acoustic sensor. In addition, exemplary devices can further comprise a charging component configured to recharge the electret.

In further non-limiting examples, exemplary methods are described that can comprise forming an electret comprising an inorganic dielectric material such as, e.g., silicon nitride, on or associated with a first electrode or a second electrode associated with a MEMS electret acoustic sensor or microphone and charging the electret to provide a potential difference between the first electrode and the second electrode. As non-limiting examples, exemplary methods can further comprise recharging the electret based on one or more of a predetermined rate of decay of the potential difference, a fixed time interval, a determination that the potential difference is less than a predetermined threshold, or a sensed mode of operation of a device associated with the MEMS electret acoustic sensor or microphone.

Moreover, exemplary systems associated with MEMS acoustic sensors or microphones are provided according to one or more aspects of the subject disclosure.

These and other embodiments are described in more detail below.

BRIEF DESCRIPTION OF THE DRAWINGS

Various non-limiting embodiments are further described with reference to the accompanying drawings in which.

DETAILED DESCRIPTION

Overview

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein.

As used herein, microelectromechanical (MEMS) systems can refer to any of a variety of structures or devices fabricated using semiconductor-like processes and exhibiting mechanical characteristics such as the ability to move or deform. For instance, such structures or devices can interact with electrical signals. As a non-limiting example, a MEMS acoustic sensor can include a MEMS transducer and an electrical interface. In addition, MEMS structures or devices can include, but are not limited to, gyroscopes, accelerometers, magnetometers, environmental sensors, pressure sensors, acoustic sensors or microphones, and radio-frequency components.

Figure 1:
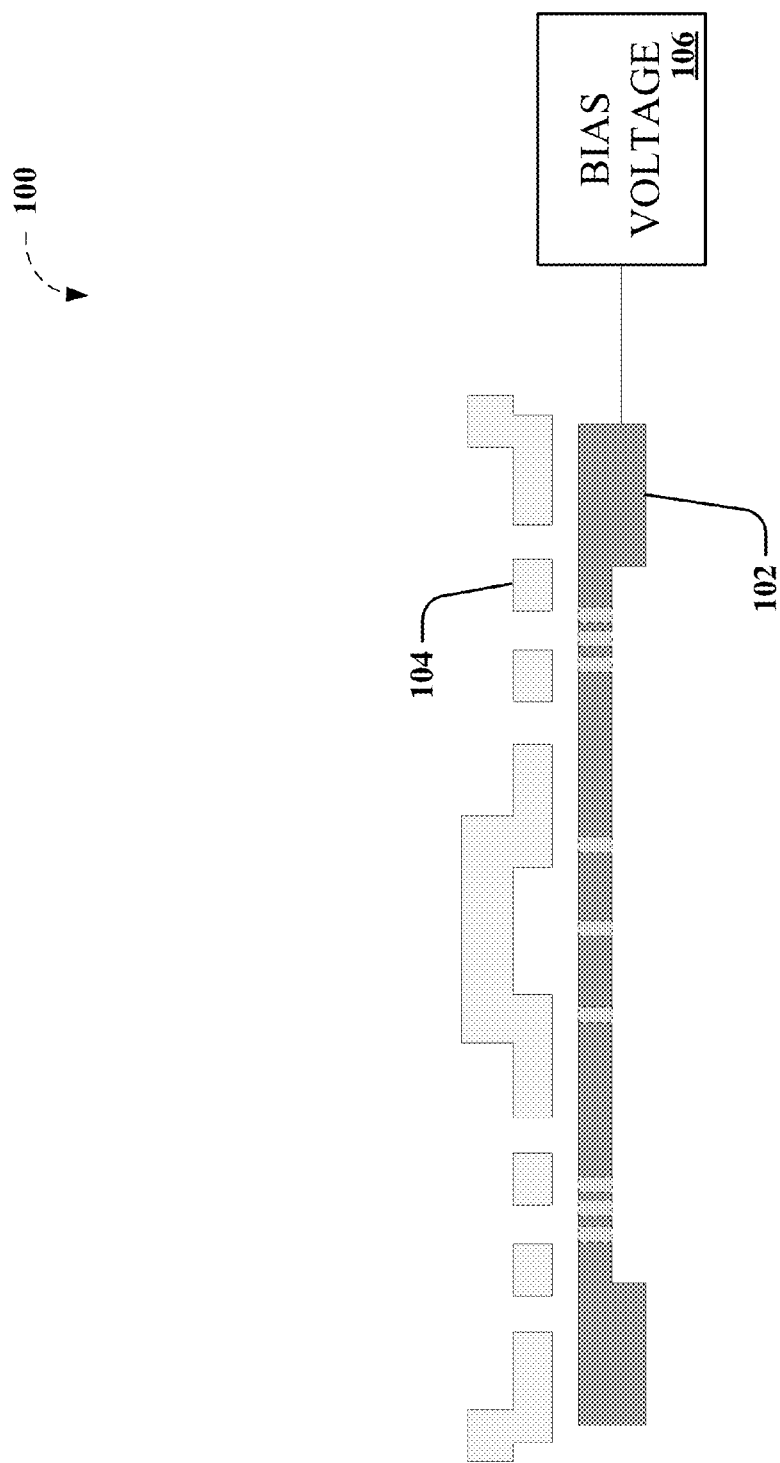
FIG. 1 depicts a conventional perforated backplate and diaphragm associated with an exemplary MEMS acoustic sensor or microphone according to aspects of the subject disclosure.

As described above, conventional, non-MEMS microphones can comprise designs employing a capacitor or condenser structure employing two generally parallel structures, such as membranes and/or electrodes. For instance in a conventional condenser microphone, a parallel structure comprising a movable membrane and a stationary electrode can be employed, and a power source can be used to generate a bias voltage or polarizing voltage between the movable membrane and the stationary electrode. As an example directed to an exemplary MEMS acoustic sensor or microphone, FIG. 1 depicts a conventional perforated backplate 102 and diaphragm 104 associated with an exemplary MEMS acoustic sensor or microphone according to aspects of the subject disclosure. As the movable membrane (e.g., diaphragm 104) moves towards or away from the stationary electrode (e.g., perforated backplate 102) in response to sound pressure, the capacitance between the movable membrane (e.g., diaphragm 104) and the stationary electrode (e.g., perforated backplate 102) can also change, and the change can be detected by electronic circuitry, such as a pre-amplifier, coupled to the MEMS acoustic sensor or microphone to process the signal produced by the sound pressure.

As noted, conventional condenser microphones require a power source (e.g., such as bias voltage 106), provided by microphone inputs on equipment as phantom power, from a small battery, and so on, for example. As an example, bias voltage 106 in traditional condenser microphones can range from 12 volts to 200 volts. Such a power source can be employed to establish the capacitor plate voltage (e.g., between the movable membrane and the stationary electrode) and can also be employed to power electronics associated with the microphone, if desired. Where such a polarizing voltage is not available or is impractical, such as in the case of low power devices, standby modes, electret condenser microphones can be employed.

Figure 2:
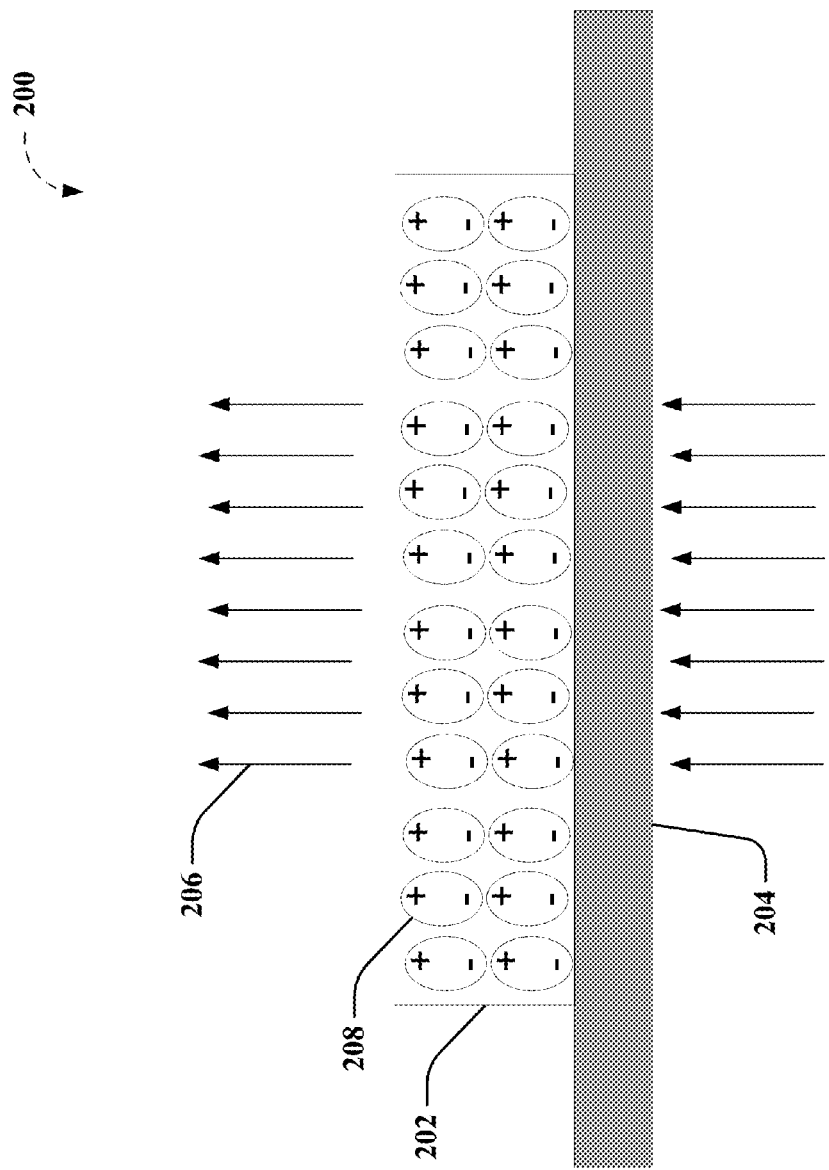
FIG. 2 depicts an exemplary electret comprising a dielectric material, deposited on an exemplary substrate, and under an applied electrostatic field.
Figure 3:
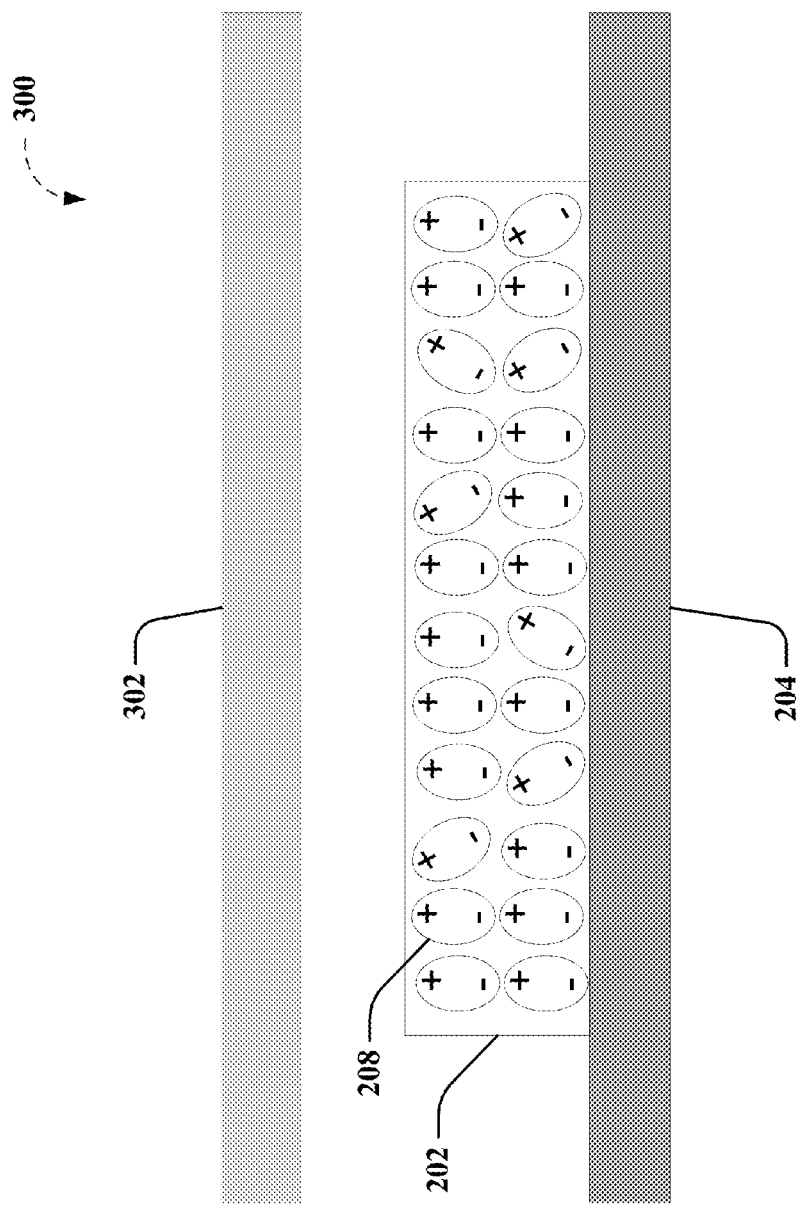
FIG. 3 depicts exemplary portions of a conventional electret microphone comprising a stationary electrode and a movable membrane.

For example, FIG. 2 depicts an exemplary electret 200 comprising a dielectric material 202, deposited on an exemplary substrate 204 (or conversely, a substrate material can be deposited on the dielectric material 202), and under an applied electrostatic field 206. FIG. 3 depicts exemplary portions of a conventional electret microphone comprising a stationary electrode (e.g., exemplary substrate 204) and a movable membrane 302. As depicted in FIGS. 2-3, conventional, non-MEMS electret microphones can also employ a parallel structure of a movable membrane 302 and a stationary electrode (e.g., exemplary substrate 204), without the use of a power source to create a bias voltage between the movable membrane and the stationary electrode. Instead, conventional non-MEMS electret microphones typically employ a charged plastic or polymer film (e.g., a dielectric material 202), which is deposited on the stationary electrode (e.g., exemplary substrate 204) to create the bias.

For instance, electrets can be made by melting a suitable dielectric material 202 (e.g., plastic, polymer, wax, etc.) that contains polar molecules (e.g., polar molecules or electrical domains 208). By allowing the suitable dielectric material 202 to re-solidify in a suitable electrostatic field 206, the polar molecules or electrical domains 208 of the dielectric material 202 can align themselves to the direction of the electrostatic field 206. Thus, the alignment can become fixed as the suitable dielectric material 202 cools and/or solidifies producing a permanent electrostatic bias. In a further non-limiting example, conventional, non-MEMS electret microphones can employ polytetrafluoroethylene (PTFE) plastic or another of a number of plastics or polymers (e.g., fluorinated ethylene propylene (FEP), perfluoroalkoxy polymer resin (PFA), polyphenylene sulfide (PPS), etc.) in a film or solute to form the electret. Suitable conventional substrate materials (e.g., exemplary substrate 204) can comprise an electrode material such as nickel (Ni), aluminum (Al), or titanium (Ti), etc., or other appropriate substrate material, which can also form portions of the movable membrane 302 which can comprise an electret material.

Accordingly, the polar molecules or electrical domains 208 can be aligned in the plastic or polymer film to create a polarized film, which can be fabricated in a conventional, non-MEMS electret microphones to create a permanent charge applied to the stationary electrode (e.g., exemplary substrate 204) or the movable membrane 302 (not shown), thus eliminating the need for a power source for generating a bias voltage. Suitable dielectric material 202 or electret material is typically capable of holding a fixed electric charge, which does not decay with time, in contrast to a conventional condenser microphone which requires a charge placed on it (e.g., via phantom power, bias voltage 106, etc.). Thus, the electret 200 comprising dielectric material 202 and having a fixed charge that remains due to the residual alignment of the polar molecules or electrical domains 208 in the absence of electrostatic field 206, can maintain a voltage across the capacitor comprised of the movable membrane 302 and a stationary electrode (e.g., exemplary substrate 204).

As described above, markets for highly integrated and low power devices require compact and low-power component designs. However, conventional MEMS microphones are analogous to traditional condenser microphones, in that they employ bias voltages (e.g., via charge pumps, etc.) to create and maintain the voltage difference between the movable membrane and the stationary electrode. Conventional MEMS microphones do not use electret designs, in part, because the suitable dielectric material (e.g., PTFE or another of a number of plastics or polymers) does not survive high temperatures encountered in MEMS processes typical of semiconductor fabrication processes. While some semiconductor electret capacitor designs for microphones have been proposed, such designs have met with limited commercial success, in part because of their retention of PTFE or other plastics or polymers, which limits the availability of processes available (e.g., due to high temperatures or other incompatible process parameters), which, in turn, can limit the ability of such designs to scale down in sizes afforded by MEMS processing. Another reason for the long felt need for such compact and low-power component designs provided by a MEMS electret microphone is that, because charge pumps can be employed in MEMS devices for a variety of complementary purposes, it is straightforward to use them in conjunction with conventional MEMS condenser microphones.

As a result, in non-limiting aspects, various embodiments can employ dielectrics in the fabrication of MEMS electret acoustic sensors or microphones compatible with MEMS processes (e.g., high temperatures or other adverse process parameters, etc.). Accordingly, in a further non-limiting aspect, various embodiments of the subject disclosure can employ one or more inorganic dielectric materials such as, e.g., silicon nitride ($Si_3N_4$), films to facilitate fabrication of MEMS electret acoustic sensors or microphones. In addition, as further described herein, various embodiments can employ periodic realignment of polar molecules or electrical domains in the dielectrics based on a predetermined rate of decay of the potential difference associated with the electret of the MEMS electret acoustic sensors or microphones.

Exemplary Embodiments

Various aspects or features of the subject disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, parameters, etc. In other instances, well-known structures, components, circuits, devices, and so on are shown in block diagram form to facilitate description and illustration of the various embodiments.

As described, conventional semiconductor electret capacitor designs for microphones retain PTFE or other plastics or polymers as a dielectric, which can limit the availability of processes available (e.g., due to high temperatures or other incompatible process parameters), which, in turn, can limit the ability of such designs to scale down in sizes afforded by MEMS processing. Accordingly, suitable substitutes for conventional dielectrics that are compatible with MEMS processing can provide fabrication economies of scale associated with semiconductor processing while allowing further scaling and integration provided by MEMS electret acoustic sensors or microphones. Thus, in non-limiting aspects, the subject disclosure can provide electret thin films and/or engineered structures that facilitate sufficient electret charge, such that the charge can be stable over time. As a non-limiting example, exemplary implementations can provide electret thin films and/or engineered structures that facilitate sufficient electret charge, such that the charge can be stable over time and supply 3 to 30 volts of bias voltage, sufficient for some MEMS electret microphone architectures. While, for purposes of illustration, and not limitation, various non-limiting examples are describe herein with reference to 3 to 30 volts of bias voltage, in other exemplary implementations, non-limiting embodiments can provide electret thin films and/or engineered structures that facilitate sufficient electret charge, such that the charge can be stable over time and supply greater than 30 volts of bias voltage, sufficient for other MEMS electret microphone architectures. As used herein, the concept of stability over time can reference a predetermined rate of decay of charge associated with electret thin films and/or engineered structures that is acceptable to the market for end-user devices, in a non-limiting aspect, depending on context.

In a further non-limiting aspect, electret thin films and/or engineered structures can be deposited and/or charged to align polar molecules or electrical domains associated with the electret thin films. In addition, various embodiments can employ periodic realignment of polar molecules or electrical domains in the dielectric based on a predetermined rate of decay of the potential difference associated with the electret of the MEMS electret acoustic sensors or microphones. As further described herein, various embodiments can employ an exemplary charge pump or other bias voltage source in conjunction with an exemplary electret layer to periodically or intermittently realigns the polarity of the polar molecules or electrical domains associated with the dielectric based on predetermined rate of decay of the potential difference associated with the electret of the MEMS electret acoustic sensors or microphones.

It is to be understood that, as used herein, the particular described examples are provided as an aid to further understanding various aspects of the disclosed subject matter. Thus, reference to particular values, depictions, and the like are not intended to limit the scope of claims appended hereto.

Figure 4:
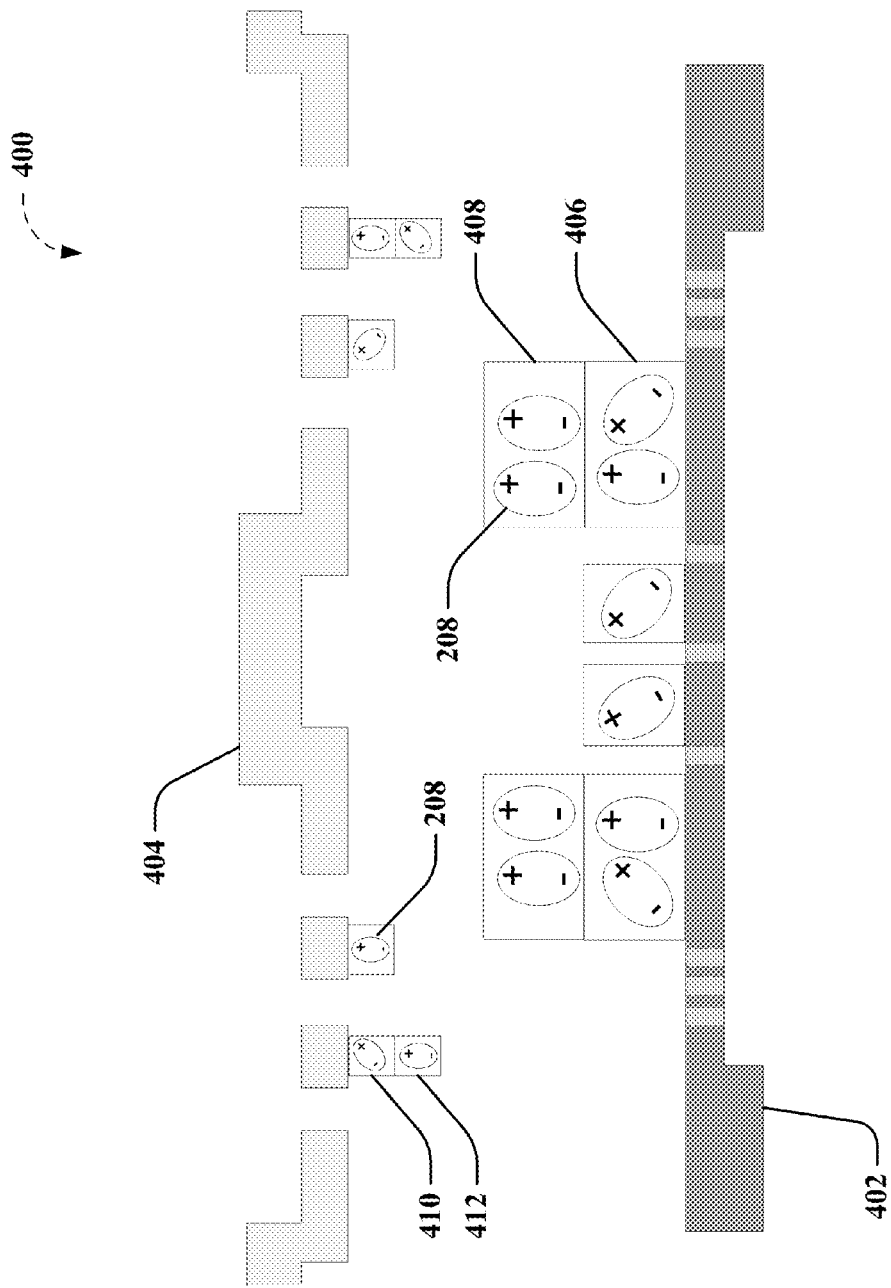
FIG. 4 illustrates a non-limiting schematic cross section depicting exemplary electret thin films and/or engineered structures associated with non-limiting aspects of a first and second electrode, comprising a stationary electrode (e.g., perforated backplate) and a movable membrane (e.g., diaphragm)

FIG. 4 illustrates a non-limiting schematic cross section depicting exemplary electret thin films and/or engineered structures associated with non-limiting aspects of a first and second electrode, comprising a stationary electrode (e.g., perforated backplate 402) and a movable membrane (e.g., diaphragm 404), that can facilitate fabrication of exemplary MEMS electret acoustic sensors or microphones. It is noted that various features depicted in FIG. 4 are enlarged for the purpose of illustration and not limitation. In a non-limiting aspect, an exemplary MEMS electret acoustic sensor or microphone can comprise a perforated backplate 402, which can comprise one or more electret thin films 406, 408.

As depicted in FIG. 4, the one or more electret thin films 406, 408 can comprise engineered structures that can comprise one or more layers, two and three dimensional patterns, and the like, and or any combination thereof to facilitate sufficient electret charge, such that the charge can be stable over time and supply 3 to 30 volts of bias voltage, sufficient for MEMS electret microphone architectures. Additionally and/or alternatively, an exemplary MEMS electret acoustic sensor or microphone can comprise a diaphragm 404, which can comprise one or more electret thin films 410, 412. In addition, the one or more electret thin films 410, 412 can comprise engineered structures that can comprise one or more layers, two and three dimensional patterns, and the like, and or any combination thereof to facilitate sufficient electret charge, such that the charge can be stable over time and supply 3 to 30 volts of bias voltage, sufficient for MEMS electret microphone architectures. It is noted that the one or more of electret thin films 406, 408, 410, 412 can be deposited and/or charged to facilitate fabrication of detection areas on the side portions of the membrane as well as a detection area across the entire membrane, for example, depositing and/or trapping charge on the stationary electrode (e.g., perforated backplate 402) and/or the movable membrane (e.g., diaphragm 404) according to particular MEMS electret microphone architectures. In other words, the location and/or configuration of the one or more of electret thin films 406, 408, 410, 412 is deposited and/or charged can be engineered to produce a non-variable potential difference is created between the stationary electrode (e.g., perforated backplate 402) and/or the movable membrane (e.g., diaphragm 404), according to particular MEMS electret microphone architectures.

As with conventional MEMS acoustic sensors the stationary electrode (e.g., perforated backplate 402) and/or the movable membrane (e.g., diaphragm 404), according to particular MEMS electret microphone architectures, can comprise suitable substrate material such as silicon and/or other electrode material such as nickel, aluminum, or titanium, etc., or other appropriate substrate material, and/or combinations thereof. As described above, one or more of electret thin films 406, 408, 410, 412 and/or associated engineered structures can be deposited and/or charged to align polar molecules or electrical domains 208 associated with the one or more electret thin films 406, 408, 410, 412. In a non-limiting aspect, one or more of electret thin films 406, 408, 410, 412 can comprise an inorganic dielectric material such as, e.g., silicon nitride, deposited and/or charged to align polar molecules or electrical domains 208 associated with the one or more electret thin films 406, 408, 410, 412 facilitate supplying 3 to 30 volts of bias voltage, sufficient for MEMS electret microphone architectures. As a non-limiting example, an inorganic dielectric material such as, e.g., silicon nitride, layer/film can be reflowed deposited in the presence of an electrostatic field such that polar molecules or electrical domains 208 associated with the one or more electret thin films 406, 408, 410, 412 can align themselves in the direction of the electrostatic field. The inorganic dielectric material such as, e.g., silicon nitride material, when fixed or solidified can trap the charge facilitate the formation of a permanent and powerful electrostatic field. It is noted that silicon nitride is only one of the potential electret materials that can be employed in the fabrication of the one or more of electret thin films 406, 408, 410, 412. Accordingly, as used herein, reference to inorganic dielectric material can refer to a number inorganic oxides, inorganic nitrides, and/or ceramics, depending on context. Moreover, inorganic dielectric materials can comprise any of a number of suitable materials comprising nitrides of silicon, oxides of silicon, nitrides of aluminum, or oxides aluminum, without limitation. Material used to create non-volatile memory components and multiple-dielectrics type materials can also be used.

As non-limiting example, various aspects of the one or more electret thin films 406, 408, 410, 412 and/or associated engineered structures can be employed to facilitate depositing, charging, and/or aligning polar molecules or electrical domains 208 associated with the one or more electret thin films 406, 408, 410, 412 to provide sufficient electret charge, such that the charge can be stable over time and supply 3 to 30 volts of bias voltage, sufficient for MEMS electret microphone architectures. In a non-limiting example, as described above, the one or more electret thin films 406, 408, 410, 412 can comprise or be associated with films of silicon nitride, a light, hard, and strong engineering ceramic that can withstand harsh environments at temperatures beyond those at which metals and polymers fail. In a further non-limiting aspect, the one or more electret thin films 406, 408, 410, 412 can comprise or be associated with films of silicon dioxide ($SiO_2$), and/or any of a number of suitable materials comprising nitrides of silicon, oxides of silicon, nitrides of aluminum, or oxides aluminum, without limitation.

In a non-limiting example, the one or more electret thin films 406, 408, 410, 412 and/or associated engineered structures can comprise a $SiO_2/Si_3N_4$ double layer. In a non-limiting aspect, an exemplary electret film can comprise a 500 nanometer (nm) layer of $SiO_2$, which can be thermally grown, and a 150 nm $Si_3N_4$ layer deposited on the layer of $SiO_2$, which can be deposited by chemical vapor deposition (e.g., low-pressure (LPCVD), atmospheric pressure chemical vapor deposition (APCVD)). In a further non-limiting aspect, the electret can be tuned, for example, by patterning the one or more electret thin films 406, 408, 410, 412 and/or associated engineered structures to include, but not limited to, variations in electret coverage, size, line width, structure depth, thereby changing the electret surface, and thus, changing the potential electrostatic force provided by the electret. In another non-limiting aspect, the one or more electret thin films 406, 408, 410, 412 and/or associated engineered structures can comprise a $SiO_2/Si_3N_4$ double layer, produced by plasma-enhanced chemical vapor deposition (PECVD).

In another non-limiting aspect, the one or more electret thin films 406, 408, 410, 412 and/or associated engineered structures can be charged to facilitate supplying 3 to 30 volts of bias voltage, sufficient for MEMS electret microphone architectures. For example, in various embodiments, the electret can be charged by means of a corona discharge, in a further non-limiting aspect, wherein the surface voltage of the electret can be controlled by varying the charge time, for example, followed by an optional thermal annealing step (e.g., annealing the electret at 140° C. for 30 minutes). In other non-limiting aspects, other charging techniques, electret modifications, and/or surface modifications can be applied provide suitable electrets (e.g., sufficient charge ability, charge stability, low residual stress, etc).

Figure 5:
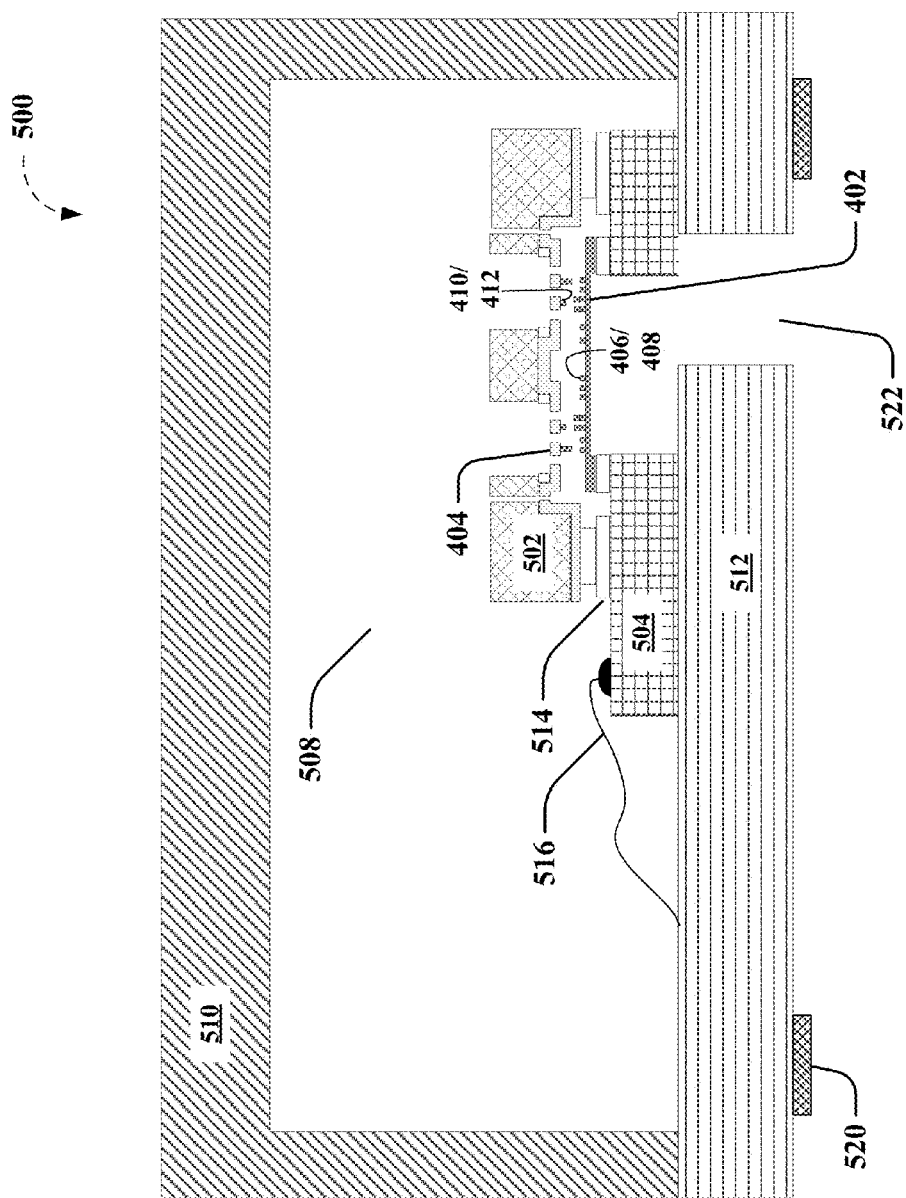
FIG. 5 depicts a non-limiting schematic cross section of a device (e.g., a MEMS electret acoustic sensor or microphone) comprising or associated with one or more electret thin films and/or associated engineered structures, according to non-limiting aspects as described herein.

Accordingly, FIG. 5 depicts a non-limiting schematic cross section of a device 500 (e.g., a MEMS electret acoustic sensor or microphone) comprising or associated with one or more electret thin films 406, 408, 410, 412 and/or associated engineered structures, according to further non-limiting aspects as described herein. Accordingly, device 500 can comprise a MEMS electret acoustic sensor or microphone element 502, such as a MEMS electret acoustic sensor or microphone element comprising or associated with a one or more electret thin films 406, 408, 410, 412 and/or associated engineered structures, as further described above regarding FIG. 4, for example. In further exemplary embodiments, device 500 can also comprise an application-specific integrated circuit (ASIC) complementary metal oxide semiconductor (CMOS) chip 504 associated with the MEMS electret acoustic sensor or microphone element 502. In various aspects, MEMS electret acoustic sensor or microphone element 502 can comprise a stationary electrode (e.g., perforated backplate 402), according to particular MEMS electret acoustic sensor or microphone architectures that can act in concert with a movable membrane (e.g., diaphragm 404) to facilitate the transduction of acoustic waves or pressure fluctuations into an electrical signal that can be communicatively coupled to ASIC CMOS 504. In a non-limiting aspect, MEMS electret acoustic sensor or microphone element 502 can be associated with a back cavity 508, which can be defined by a lid or cover 510 attached to package substrate 512, according to a non-limiting aspect.

In various non-limiting aspects, one or more of MEMS electret acoustic sensor or microphone element 502, ASIC CMOS chip 504, and/or lid or cover 510 can be one or more of electrically coupled or mechanically affixed to package substrate 512, via methods available to those skilled in the art. As non-limiting examples, MEMS electret acoustic sensor or microphone element 502 can be bonded 514 and electrically coupled to ASIC CMOS chip 504, and ASIC CMOS chip 504 can be bonded and electrically coupled (e.g., wire bonded 506) to package substrate 512. Thus, a MEMS electret acoustic sensor or microphone element 502, in the non-limiting example of device 500, is mechanically, electrically, and/or communicatively coupled to the ASIC CMOS chip 504.

Furthermore, lid or cover 510 and package substrate 512 together can comprise MEMS electret acoustic sensor or microphone device or package 500, to which a customer printed circuit board (PCB) (not shown) having an orifice or other means of passing acoustic waves or pressure to MEMS electret acoustic sensor or microphone element 502 can be mechanically, electrically, and/or communicatively coupled (e.g., via solder 520, etc.). For example, acoustic waves can be received at MEMS electret acoustic sensor or microphone element 502 via package substrate 512 having port 522 adapted to receive acoustic waves or pressure. An attached or coupled customer PCB (not shown) providing an orifice or other means of passing the acoustic waves facilitates receiving acoustic waves or pressure at MEMS electret acoustic sensor or microphone element 502.

Accordingly, MEMS electret acoustic sensor or microphone device or package 500 can comprise or be associated with one or more of electret thin films 406, 408, 410, 412 that can be formed or deposited on one or more of a stationary electrode (e.g., perforated backplate 402), according to particular non-limiting MEMS electret acoustic sensor or microphone architectures, and/or a movable membrane (e.g., diaphragm 404), according to further non-limiting MEMS electret acoustic sensor or microphone architectures. In a further non-limiting aspect, the one or more of electret thin films 406, 408, 410, 412 can be engineered and/or charged to produce a non-variable potential difference between the stationary electrode (e.g., perforated backplate 402) and/or the movable membrane (e.g., diaphragm 404), according to particular MEMS electret microphone architectures. Thus, in non-limiting aspects, the subject disclosure can provide electret thin films and/or engineered structures that facilitate sufficient electret charge, such that the charge can be stable over time and supply 3 to 30 volts of bias voltage, sufficient for MEMS electret microphone architectures (e.g., MEMS electret acoustic sensor or microphone element 502).

In another non-limiting aspect, where the electret charge decays over a particular interval (e.g., corresponding to a predetermined rate of decay), depending on the configuration and/or material(s) employed in the one or more of electret thin films 406, 408, 410, 412, further non-limiting implementations can employ a bias voltage selectively, intermittently, and/or periodically based on an anticipated or determined loss in charge associated with the one or more of electret thin films 406, 408, 410, 412. Specifically, if the polar molecules or electrical domains 208 were to start losing alignment, thus losing sufficient electret charge, such that the charge provides less than approximately 3 to 30 volts of bias voltage sufficient for MEMS electret microphone architectures (e.g., MEMS electret acoustic sensor or microphone element 502), a bias voltage can be resupplied (e.g., via a standby charge pump) to realign polar molecules or electrical domains 208 back in the desired orientation.

Figure 6:
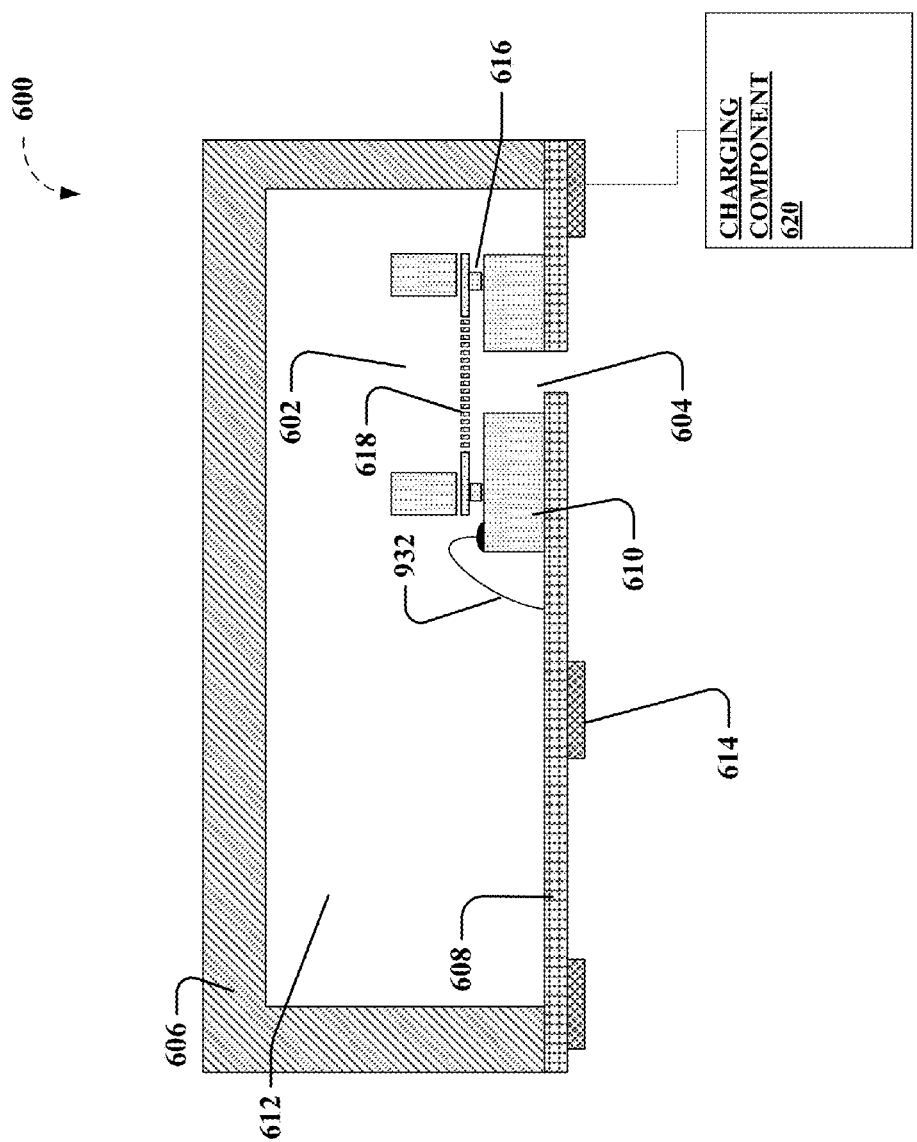
FIG. 6 depicts a non-limiting schematic cross section of a device (e.g., a MEMS electret acoustic sensor or microphone) comprising or associated with one or more electret thin films and/or associated engineered structures, according to further non-limiting aspects as described herein.

For example, FIG. 6 depicts a non-limiting schematic cross section of a device 600 (e.g., a MEMS electret acoustic sensor or microphone) comprising or associated with one or more electret thin films 406, 408, 410, 412 and/or associated engineered structures, according to further non-limiting aspects as described herein. Accordingly, exemplary MEMS electret acoustic sensor or microphone 600 comprising MEMS electret acoustic sensor 602 can further comprise a port 604, a lid (or cover) 606, a package substrate 608, a MEMS electret acoustic sensor integrated circuit (IC) substrate 610, and a back cavity 612. Solder 614 can connect exemplary MEMS electret acoustic sensor or microphone 600 to external substrates, such as, for example, a PCB having an orifice or other means of passing acoustic waves or pressure to MEMS electret acoustic sensor 602. The lid (or cover) 606 and the package substrate 608 can form a "package." While the exemplary MEMS electret acoustic sensor 602 is shown physically separate from and mechanically, electrically, and/or communicatively coupled (e.g., via standoffs 616, etc.) exemplary MEMS electret acoustic sensor IC substrate 610, for the purpose of illustration, and not limitation, it is understood that variations of physical configurations of exemplary MEMS electret acoustic sensor or microphone 600 are possible.

According to a non-limiting aspect of exemplary MEMS electret acoustic sensor or microphone 600, MEMS electret acoustic sensor 602 can comprise a microphone, such as, but not limited to, a MEMS electret acoustic sensor or microphone (e.g., MEMS electret acoustic sensor or microphone element 502) as described above regarding FIGS. 4-5, for example. In such embodiments, a MEMS electret acoustic sensor element 618 can be a micromachined structure that can move in response to an acoustic signal, e.g., received via port 604. Standoffs 616 can provide a conductive path and can separate the MEMS electret acoustic sensor element 618 from the MEMS electret acoustic sensor IC substrate 610. In a particular non-limiting implementation, MEMS electret acoustic sensor element 618 and a stationary electrode layer disposed on the MEMS electret acoustic sensor IC substrate 610 can collectively form an electret capacitor as described above, where capacitance can vary as the distance between the MEMS electret acoustic sensor element 618 and the MEMS electret acoustic sensor IC substrate 610 varies due to the movement of the MEMS electret acoustic sensor element 618 caused by acoustic pressure variations of the acoustic signal.

As described above, if the polar molecules or electrical domains 208 were to start losing alignment, thus losing sufficient electret charge, such that the charge provides less than approximately 3 to 30 volts of bias voltage sufficient for MEMS electret microphone architectures (e.g., MEMS electret acoustic sensor or microphone element 502, MEMS electret acoustic sensor 602), a bias voltage can be resupplied (e.g., via a standby charge pump) to realign polar molecules or electrical domains 208 back in the desired orientation. Thus, for exemplary implementations where the electret charge is expected to decay over a particular interval (e.g., corresponding to a predetermined rate of decay), depending on the configuration and/or material(s) employed in the one or more of electret thin films 406, 408, 410, 412, further non-limiting implementations can employ a bias voltage selectively, intermittently, and/or periodically based on an anticipated or determined loss in charge associated with the one or more of electret thin films 406, 408, 410, 412.

Thus, further non-limiting embodiments of a MEMS electret acoustic sensor or microphone 600 can comprise or be associated with a charging component 620, configured to one or more of determine a loss of charge or voltage associated with the one or more of electret thin films 406, 408, 410, 412, employ a bias voltage selectively (e.g., based on a determined loss of charge or voltage), intermittently, and/or periodically (e.g., based on an anticipated or determined loss in charge associated with the one or more of electret thin films 406, 408, 410, 412, etc.), and so on. Note that, while charging component 620 is depicted external to the package formed by lid (or cover) 606 and the package substrate 608, all or a subset of functionality of charging component 620 can be provided by MEMS electret acoustic sensor IC substrate 610 within package formed by lid (or cover) 606 and the package substrate 608, as well as by other ancillary or complementary electronic components in a host system.

Figure 7:
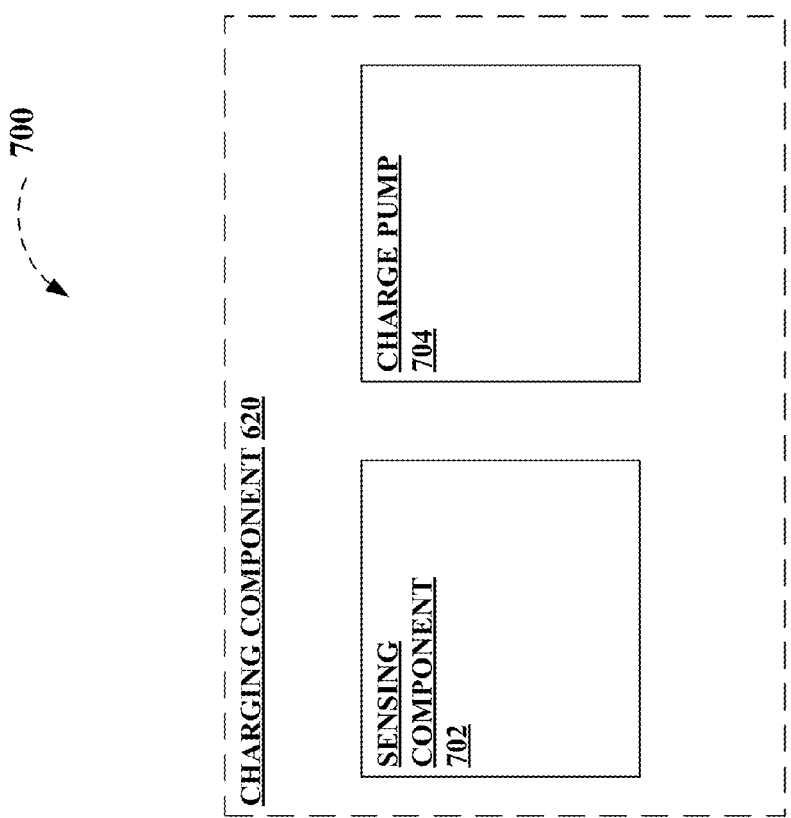
FIG. 7 depicts a functional block diagram of an exemplary charging component, according to further non-limiting aspects.

FIG. 7 depicts a functional block diagram 700 of an exemplary charging component 620, according to further non-limiting aspects. In a non-limiting aspect, charging component 620 can comprise a sensing component 702 and/or an exemplary charge pump 704. Exemplary charge pump 704 can be power-cycled to restore charge on the electret. In further non-limiting aspect, charging component 620 can be configured to power-cycle exemplary charge pump 704 (e.g., by using a ramp signal), frequently (e.g., after a predetermined interval based on a predetermined rate of charge decay), based in part on the configuration and/or material(s) employed in the one or more of electret thin films 406, 408, 410, 412. In another non-limiting aspect, charging component 620 can be configured to cycle exemplary charge pump semaphore less frequently (e.g., after a longer interval, based in part on a predetermined rate of charge and/or potential difference decay and/or other factors such as sensing of modes of operation, such as device power states, etc.), based in part on the configuration and/or material(s) employed in the one or more of electret thin films 406, 408, 410, 412. In addition, as further described herein, charging component 620 can be configured to cycle an exemplary charge pump 704 can be cycled upon detection or determination by sensing component 702 of decay in the electret charge (e.g., the provided potential difference being below a predetermined threshold). Thus, exemplary charging component 620 can facilitate these and other functions to enable an exemplary charge pump to realign the polar molecules or electrical domains 208 thereby replenishing the electret.

As described above, regarding FIG. 4, for example, various configurations of the one or more of electret thin films 406, 408, 410, 412 can be engineered and/or charged to produce a non-variable potential difference between the stationary electrode (e.g., perforated backplate 402, stationary electrode layer disposed on the MEMS electret acoustic sensor IC substrate 610, etc.) and/or the movable membrane (e.g., diaphragm 404, MEMS electret acoustic sensor element 618), according to particular MEMS electret microphone architectures. Accordingly, in a non-limiting embodiment, an exemplary electret film can be disposed on the stationary electrode (e.g., perforated backplate 402, stationary electrode layer disposed on the MEMS electret acoustic sensor IC substrate 610, etc.). In another exemplary implementation, an exemplary electret film can be disposed on the movable membrane (e.g., diaphragm 404, MEMS electret acoustic sensor element 618). In the latter exemplary implementation, the movable membrane can be stiffened by the addition of an exemplary electret film, which could provide exemplary implementations suitable to higher sound pressure levels. However, further processing of the exemplary electret film (e.g., such as by ion implantation or other processes) can also be employed to reduce the tensile stress of such films to restore resiliency in the movable membrane.

In yet another embodiment, the diaphragm can comprise $Si_3N_4$ or another electret material, and so on, without limitation.

Furthermore, the concept of stability over time can reference a predetermined rate of decay of charge associated with electret thin films and/or engineered structures that is acceptable to the market for end-user devices, in a non-limiting aspect, depending on context. Thus, reference to a non-variable potential difference can refer to a varying potential difference whose variance over the timeframe of reference is insignificant relative to the variable or parameter of interest (e.g., momentary variations of sound pressure versus variations in potential difference occurring on a timescale of days, weeks, months, years, etc.), depending on context.

Accordingly, in various non-limiting embodiments, the subject disclosure provides devices and systems associated with MEMS electret acoustic sensors or microphones. As a non-limiting example, an exemplary device (e.g., device 500, 600 comprising a MEMS electret acoustic sensor or microphone, etc.) can comprise a first electrode (e.g., one of a stationary electrode and/or a movable membrane, etc.) associated with a MEMS electret acoustic sensor or microphone (e.g., device 500, 600 comprising a MEMS electret acoustic sensor or microphone, etc.) and a second electrode (e.g., the other of a stationary electrode and/or a movable membrane, etc.) associated with the MEMS electret acoustic sensor or microphone (e.g., device 500, 600 comprising a MEMS electret acoustic sensor or microphone, etc.). In a further non-limiting aspect, an exemplary device can further comprise an electret (e.g., one or more of electret thin films 406, 408, 410, 412, etc.) comprising an inorganic dielectric material such as, e.g., silicon nitride, disposed on or associated with the first electrode or the second electrode. As further described above, the electret (e.g., one or more of electret thin films 406, 408, 410, 412, etc.) can facilitate storing a charge to provide a potential difference between the first electrode and the second electrode associated with the MEMS electret acoustic sensor or microphone (e.g., device 500, 600 comprising a MEMS electret acoustic sensor or microphone, etc.).

In various non-limiting aspects, the electret (e.g., one or more of electret thin films 406, 408, 410, 412, etc.) can also comprise other inorganic dielectric materials such as, e.g., silicon dioxide and silicon nitride, as further described above. In a non-limiting implementation, the first electrode (e.g., one of a stationary electrode and/or a movable membrane, etc.) can comprise the electret (e.g., one or more of electret thin films 406, 408, 410, 412, etc.), and the second electrode (e.g., the other of a stationary electrode and/or a movable membrane, etc.) can also comprise another electret (e.g., one or more of electret thin films 406, 408, 410, 412, etc.). In a further non-limiting implementation of an exemplary device, the first electrode can comprise a stationary electrode (e.g., perforated backplate 402, a stationary electrode layer disposed on the MEMS electret acoustic sensor IC substrate 610, etc.) comprising the electret (e.g., one or more of electret thin films 406, 408, etc.). In another non-limiting implementation of an exemplary device, the second electrode can comprise a movable membrane (e.g., diaphragm 404, MEMS electret acoustic sensor element 618, etc.) comprising the electret (e.g., one or more of electret thin films 410, 412, etc.).

In further non-limiting implementations, an exemplary device can comprise or be associated with a charging component (e.g., charging component 620, ASIC CMOS chip 504, MEMS electret acoustic sensor IC substrate 610, and/or portions or combinations thereof, etc.) configured to recharge the electret (e.g., one or more of electret thin films 406, 408, 410, 412, etc.). As non-limiting examples, an exemplary charging component (e.g., charging component 620, ASIC CMOS chip 504, MEMS electret acoustic sensor IC substrate 610, and/or portions or combinations thereof, etc.) can be configured to recharge the electret (e.g., one or more of electret thin films 406, 408, 410, 412, etc.) based in part on a predetermined rate of decay of the potential difference, a determination that the potential difference is less than a predetermined threshold, a fixed time interval, and/or a sensed mode of operation (e.g., power modes, including reduced power modes, such as standby modes, etc.) of a device associated with the MEMS electret acoustic sensor or microphone (e.g., device 500, 600 comprising a MEMS electret acoustic sensor or microphone, etc.), and/or inferences about the foregoing, for example, as further described above regarding FIGS. 6-7. In a further non-limiting aspect, an exemplary charging component (e.g., charging component 620, ASIC CMOS chip 504, MEMS electret acoustic sensor IC substrate 610, and/or portions or combinations thereof, etc.) can be configured to determine the charge on the electret (e.g., one or more of electret thin films 406, 408, 410, 412, etc.) based on the potential difference.

According to further non-limiting implementations, the subject disclosure provides exemplary systems that can comprise a MEMS electret acoustic sensor or microphone (e.g., device 500, 600 comprising a MEMS electret acoustic sensor or microphone, etc.) comprising a first electrode (e.g., one of a stationary electrode and/or a movable membrane, etc.) and a second electrode (e.g., the other of a stationary electrode and/or a movable membrane, etc.). Exemplary systems can further comprise an electret (e.g., one or more of electret thin films 406, 408, 410, 412, etc.) comprising an inorganic dielectric material such as, e.g., silicon nitride, for example, as further described above regarding FIG. 4, etc., for example. In a non-limiting aspect, an exemplary electret can be disposed on or be associated with the first electrode (e.g., one of a stationary electrode and/or a movable membrane, etc.) or the second electrode (e.g., the other of a stationary electrode and/or a movable membrane, etc.). As further described herein, the electret (e.g., one or more of electret thin films 406, 408, 410, 412, etc.) can store a charge to facilitate providing a potential difference (e.g., to facilitate sufficient electret charge, such that the charge can be stable over time and supply 3 to 30 volts of bias voltage, sufficient for MEMS electret microphone architectures such as, MEMS electret acoustic sensor or microphone element 502, MEMS electret acoustic sensor 602, etc.) between the first electrode and the second electrode.

In a non-limiting aspect, the first electrode can comprise a stationary electrode (e.g., perforated backplate 402, a stationary electrode layer disposed on the MEMS electret acoustic sensor IC substrate 610, etc.) and the second electrode can comprise a movable membrane (e.g., diaphragm 404, MEMS electret acoustic sensor element 618, etc.), as further described herein. In further non-limiting aspects, exemplary systems described herein can further comprise a charging component (e.g., charging component 620, ASIC CMOS chip 504, MEMS electret acoustic sensor IC substrate 610, and/or portions or combinations thereof, etc.) configured to intermittently or periodically recharge the electret (e.g., one or more of electret thin films 406, 408, 410, 412, etc.). As a non-limiting example, an exemplary charging component (e.g., charging component 620, ASIC CMOS chip 504, MEMS electret acoustic sensor IC substrate 610, and/or portions or combinations thereof, etc.) can be configured to recharge the electret (e.g., one or more of electret thin films 406, 408, 410, 412, etc.), based in part on one or more of a predetermined rate of decay of the potential difference, a fixed time interval, a determination that the potential difference is less than a predetermined threshold, and/or a sensed mode of operation (e.g., power modes, including reduced power modes, such as standby modes, etc.) of a device associated with the MEMS electret acoustic sensor or microphone (e.g., device 500, 600 comprising a MEMS electret acoustic sensor or microphone, etc.), and/or inferences about the foregoing, for example, as further described above regarding FIGS. 6-7.

Figure 8:
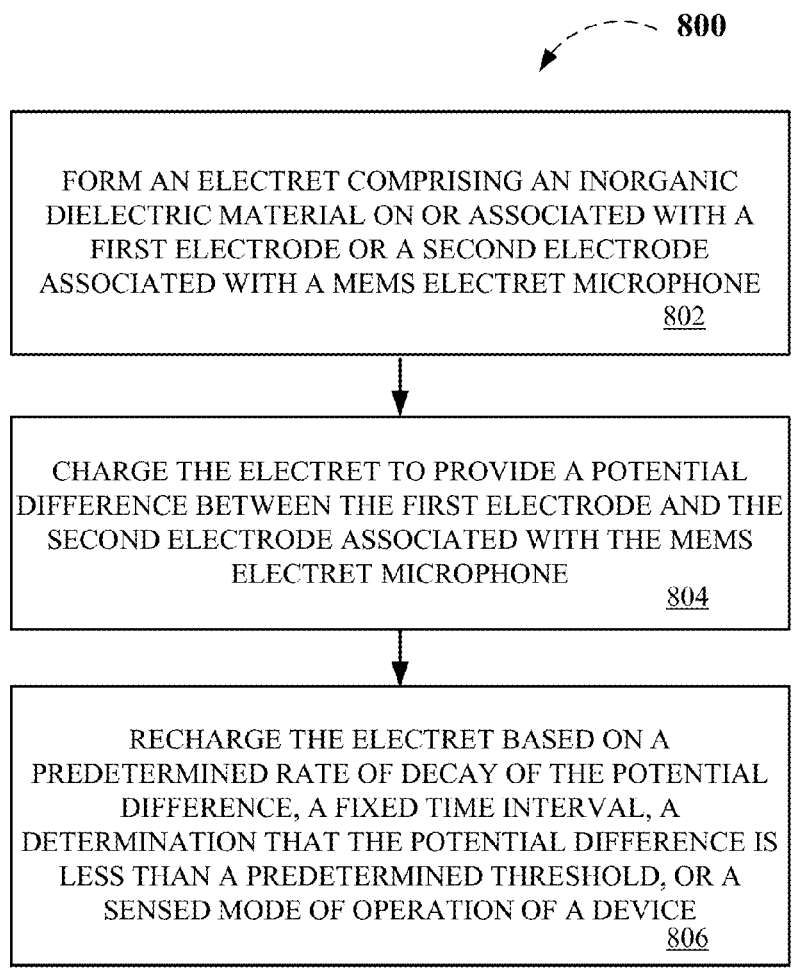
FIG. 8 provides a non-limiting flow diagram of exemplary methods according to various non-limiting aspects as described herein.

In view of the subject matter described supra, methods that can be implemented in accordance with the subject disclosure will be better appreciated with reference to the flowcharts of FIG. 8. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

FIG. 8 provides a non-limiting flow diagram of exemplary methods 800 according to various non-limiting aspects as described herein. For instance, at 802, exemplary methods 800 can comprise forming an electret (e.g., one or more of electret thin films 406, 408, 410, 412, etc.) comprising an inorganic dielectric material such as, e.g., silicon nitride, on or associated with a first electrode (e.g., one of a stationary electrode and/or a movable membrane, etc.) or a second electrode (e.g., the other of a stationary electrode and/or a movable membrane, etc.) associated with a MEMS electret acoustic sensor or microphone (e.g., device 500, 600 comprising a MEMS electret acoustic sensor or microphone, etc.), for example, as further described above regarding FIG. 4. As a non-limiting example, at 802, exemplary methods 800 can comprise forming the electret (e.g., one or more of electret thin films 406, 408, etc.) on a stationary electrode (e.g., perforated backplate 402, a stationary electrode layer disposed on the MEMS electret acoustic sensor IC substrate 610, etc.) comprising the first electrode. In a further non-limiting example, exemplary methods 800 can also comprise forming the electret (e.g., one or more of electret thin films 410, 412, etc.) on a movable membrane (e.g., diaphragm 404, MEMS electret acoustic sensor element 618, etc.) comprising the second electrode. In a further non-limiting aspect, forming the electret (e.g., one or more of electret thin films 406, 408, 410, 412, etc.) can also include forming the electret comprising other inorganic dielectric materials such as, e.g., silicon dioxide and the silicon nitride, as further described above.

In addition, exemplary methods 800 can further comprise, at 804, charging the electret (e.g., one or more of electret thin films 406, 408, 410, 412, etc.) to provide a potential difference (e.g., to facilitate sufficient electret charge, such that the charge can be stable over time and supply 3 to 30 volts of bias voltage, sufficient for MEMS electret microphone architectures such as, MEMS electret acoustic sensor or microphone element 502, MEMS electret acoustic sensor 602, etc.) between the first electrode and the second electrode associated with the MEMS electret acoustic sensor or microphone (e.g., device 500, 600 comprising a MEMS electret acoustic sensor or microphone, etc.).

At 806, exemplary methods 100 can further comprise recharging (e.g., charging component 620, ASIC CMOS chip 504, MEMS electret acoustic sensor IC substrate 610, and/or portions or combinations thereof, etc.) the electret (e.g., one or more of electret thin films 406, 408, 410, 412, etc.), based in part on one or more of a predetermined rate of decay of the potential difference, a fixed time interval, a determination that the potential difference is less than a predetermined threshold, and/or a sensed mode of operation (e.g., power modes, including reduced power modes, such as standby modes, etc.) of a device associated with the MEMS electret acoustic sensor or microphone (e.g., device 500, 600 comprising a MEMS electret acoustic sensor or microphone, etc.), and/or inferences about the foregoing, for example, as further described above regarding FIGS. 6-7.

It can be understood that while a brief overview of exemplary systems, methods, scenarios, and/or devices has been provided, the disclosed subject matter is not so limited. Thus, it can be further understood that various modifications, alterations, addition, and/or deletions can be made without departing from the scope of the embodiments as described herein. Accordingly, similar non-limiting implementations can be used or modifications and additions can be made to the described embodiments for performing the same or equivalent function of the corresponding embodiments without deviating therefrom.

As used in this application, the terms "component," "module," "device" and "system" can refer to a computer-related entity, either hardware, a combination of hardware and software, software, or software in execution. As one example, a component or module can be, but is not limited to being, a process running on a processor, a processor or portion thereof, a hard disk drive, multiple storage drives (of optical and/or magnetic storage medium), an object, an executable, a thread of execution, a program, and/or a computer. By way of illustration, both an application running on a server and the server can be a component or module. One or more components or modules scan reside within a process and/or thread of execution, and a component or module can be localized on one computer or processor and/or distributed between two or more computers or processors.

As used herein, the term to "infer" or "inference" can refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A device, comprising:
   a first electrode associated with a microelectromechanical systems (MEMS) electret acoustic sensor;
   a second electrode associated with the MEMS electret acoustic sensor; and
   an electret comprising an inorganic dielectric material, disposed on or associated with the first electrode or the second electrode, that stores a charge to provide a potential difference between the first electrode and the second electrode associated with the MEMS electret acoustic sensor.

2. The device of claim 1, further comprising:
   a charging component configured to recharge the electret based at least in part on a predetermined rate of decay of the potential difference.

3. The device of claim 2, wherein the charging component is further configured to determine the charge on the electret based on the potential difference.

4. The device of claim 3, wherein the charging component is further configured to charge the electret based at least in part on a determination that the potential difference is less than a predetermined threshold.

5. The device of claim 1, wherein the first electrode comprises a stationary electrode comprising the electret.

6. The device of claim 5, wherein the stationary electrode comprises a perforated backplate.

7. The device of claim 1, wherein the second electrode comprises a movable membrane comprising the electret.

8. The device of claim 7, wherein the movable membrane comprises a diaphragm consisting of the electret.

9. The device of claim 1, wherein the inorganic dielectric material comprises at least one material selected from groups of materials comprising nitrides of silicon, oxides of silicon, nitrides of aluminum, or oxides of aluminum.

10. The device of claim 1, wherein the first electrode comprises the electret and the second electrode comprises another electret.

11. A method, comprising:
    forming an electret comprising an inorganic dielectric material on or associated with a first electrode or a second electrode associated with a microelectromechanical systems (MEMS) electret microphone; and charging the electret to provide a potential difference between the first electrode and the second electrode associated with the MEMS electret microphone.

12. The method of claim 11, further comprising:
recharging the electret based at least in part on at least one of a predetermined rate of decay of the potential difference, a fixed time interval, a determination that the potential difference is less than a predetermined threshold, or a sensed mode of operation of a device associated with the MEMS electret microphone.

13. The method of claim 11, wherein the forming the electret comprises forming the electret comprising at least one material selected from groups of materials comprising nitrides of silicon, oxides of silicon, nitrides of aluminum, or oxides aluminum.

14. The method of claim 11, wherein the forming the electret comprises forming the electret on a stationary electrode comprising the first electrode.

15. The method of claim 11, wherein the forming the electret comprises forming the electret on a perforated backplate comprising the first electrode.

16. The method of claim 11, wherein the forming the electret comprises forming the electret on a movable membrane comprising the second electrode.

17. The method of claim 11, wherein the forming the electret comprises forming the electret as a diaphragm comprising the second electrode.

18. A system, comprising:
a microelectromechanical systems (MEMS) electret acoustic sensor comprising:
a first electrode;
a second electrode;
an electret comprising an inorganic dielectric material, disposed on or associated with the first electrode or the second electrode, that stores a charge to provide a potential difference between the first electrode and the second electrode; and
a charging component configured to intermittently recharge the electret.

19. The system of claim 18, wherein the first electrode comprises a stationary electrode and the second electrode comprises a movable membrane.

20. The system of claim 18, wherein the charging component is further configured to recharge the electret based at least in part on at least one of a predetermined rate of decay of the potential difference, a fixed time interval, a determination that the potential difference is less than a predetermined threshold, a sensed mode of operation of a device associated with the MEMS electret acoustic sensor.

* * * * *